United States Patent

Uedo et al.

[11] Patent Number: 5,516,989
[45] Date of Patent: May 14, 1996

[54] STRUCTURE OF THE FLEXING SECTION OF A MULTILAYER FLEXIBLE CIRCUIT BOARD

[75] Inventors: Shigeo Uedo, Ushiku; Hitoshi Itou, Ushiu, both of Japan

[73] Assignee: Nippon Mektron, Ltd., Tokyo, Japan

[21] Appl. No.: 387,283

[22] Filed: Feb. 10, 1995

[30] Foreign Application Priority Data

May 16, 1994 [JP] Japan .................................. 6-125722

[51] Int. Cl.⁶ .................................................... H05K 1/00
[52] U.S. Cl. ............................ 174/254; 174/250; 361/749; 439/77
[58] Field of Search .................................. 174/250, 254; 361/749; 439/67, 77

[56] References Cited

U.S. PATENT DOCUMENTS

| | | | |
|---|---|---|---|
| 4,403,273 | 9/1983 | Larson et al. ........................ | 361/398 |
| 4,911,643 | 3/1990 | Perry et al. .......................... | 439/67 |
| 5,103,375 | 4/1992 | Cottingham et al. ................. | 361/386 |
| 5,229,916 | 7/1993 | Frankeny et al. ..................... | 361/386 |
| 5,397,239 | 3/1995 | Zaderej et al. ....................... | 439/55 |
| 5,408,052 | 4/1995 | Inaba et al. .......................... | 174/261 |
| 5,428,190 | 6/1995 | Stopperan ............................. | 174/261 |
| 5,434,362 | 7/1995 | Klosowiak et al. ................... | 174/254 |
| 5,461,202 | 10/1995 | Sera et al. ............................ | 174/254 |

*Primary Examiner*—Laura Thomas
*Attorney, Agent, or Firm*—Chilton, Alix & Van Kirk

[57] ABSTRACT

A structure of the flexing section of a multilayer flexible circuit board wherein at least one layer of a flexible insulation base material is bonded, via an adhesive agent layer, between a plurality of wiring conductors on which required wiring patterns are formed with conductive foil, the flexible insulation base material of the flexing section of the multilayer flexible circuit board being provided with a non-bonded portion so that it is not bonded with the wiring conductors or another flexible insulation base material at least on one surface.

17 Claims, 2 Drawing Sheets

STRUCTURE OF THE FLEXING SECTION OF A MULTILAYER FLEXIBLE CIRCUIT BOARD

BACKGROUND OF THE INVENTION

1. Field of the Invention

The present invention relates to a structure of the flexing section of a multilayer flexible circuit board, which improves the flexibility of the flexing section of a multilayer flexible circuit board having a plurality of wiring conductors on which desired wiring patterns are formed with conductive foil.

2. Description of the Related Art

A conventional multilayer flexible circuit board which has a plurality of wiring conductors has a structure, wherein the respective wiring conductors including a flexing section are uniformly bonded with a flexible insulation base material using an adhesive agent. This unavoidably leads to deterioration in the flexing resistance of the flexing section. Depending on conditions, a few times of bending causes cracks in the wiring conductors, resulting in disconnection.

Such a problem is attributable to the distortion, particularly stretching and compressing, which occurs in the wiring conductors due to bending. Particularly in the case of a double-sided flexible circuit board, the flexing resistance deteriorates as the overall thickness of the circuit board increases because the wiring conductors are fixed with an adhesive agent.

SUMMARY OF THE INVENTION

Accordingly, it is an object of the present invention to provide a structure of the flexing section of a multilayer flexible circuit board, which structure is designed to achieve improved flexing resistance of the flexing section of a multilayer or double-sided flexible circuit board while keeping the characteristics thereof intact.

To this end, according to the structure of the flexing section of a multilayer flexible circuit board in accordance with the present invention, in a multilayer flexible circuit board wherein at least one layer of flexible insulation base material i.e., a substrate sandwiched between wiring patterns formed form conductive foil, the flexible insulation base material of the flexing section of the multilayer flexible circuit board is provided with a non-bonded portion, i.e., a portion wherein relative movement between the wiring patterns may occur at least on one surface.

The multilayer flexible circuit board stated above can be composed by laminating adhesive-free board with copper lined on one surface. Further, the non-bonded portion can be located inside the flexing section of the wiring conductor in the multilayer flexible circuit board.

DETAILED DESCRIPTION OF THE PREFERRED EMBODIMENTS

Figure 1:
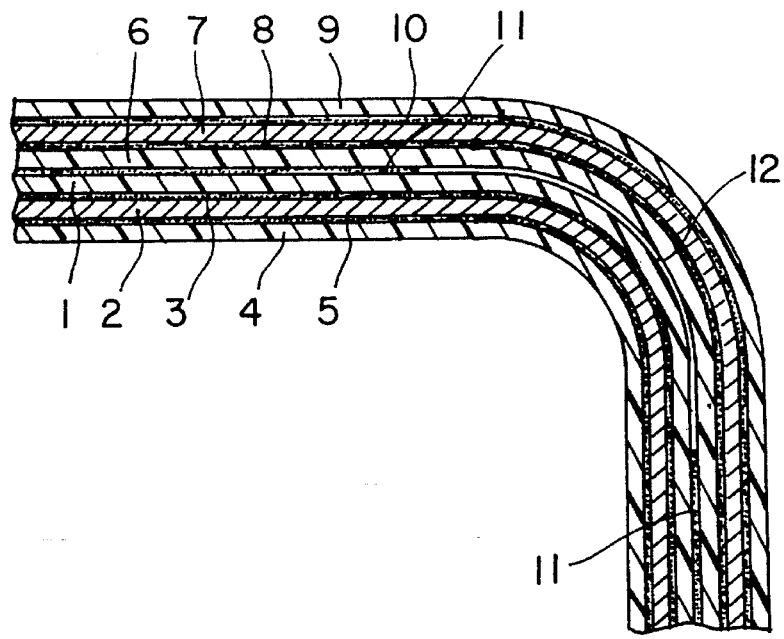
FIG. 1 is a conceptual enlarged cross-sectional view which shows the structure of the essential part of the flexing section of a multilayer flexible circuit board according to an embodiment of the present invention.

The present invention will be described in detail with conjunction with the illustrated embodiments. FIG. 1 is the conceptual enlarged cross-sectional view which shows the structure of the essential part of the flexing section of a multilayer flexible circuit board according to an embodiment of the present invention.

In the drawing, one flexible circuit board is constituted by a wiring conductor 2 on which a desired wiring pattern has been formed with conductive foil such as copper foil, the wiring conductor 2 being mounted, via an appropriate adhesive agent layer 3, on one surface of an appropriate flexible non-conductive substrate 1, i.e., a base comprised of, for example, polyimide film or the like. The surface of the wiring conductor 2 is covered with a surface protective layer 4 made of an appropriate insulating film such as polyimide film via an adhesive agent layer 5 so as to constitute a single-layer flexible circuit board.

Likewise, in the other flexible circuit board, a desired wiring conductor 7 is formed, via an adhesive agent layer 8, on the top surface of a flexible insulation base material 6 comprised of similar components to those of the aforesaid flexible circuit board. The surface of the wiring conductor 7 is covered, via an adhesive agent layer 10, with a similar surface protective layer 9 so as to configure another single-layer flexible circuit board.

These two flexible circuit boards are mutually laminated and bonded with an adhesive agent so that the flexible insulation base materials 1 and 6 thereof face against each other. At this time, a non-bonded portion 12 is formed so that the flexible insulation base materials are not bonded at the flexing sections as illustrated; the areas other than the flexing sections are mutually bonded with the adhesive agent to form a bonded portion 11.

According to the structure of the flexing section of the multilayer flexible circuit board shown in FIG. 1, a plurality of single-layer flexible circuit boards adjoin in the non-bonded portion 12, which is free of an adhesive agent, of the flexing section; therefore, the expansion and contraction of the wiring conductors 2 and 7 caused by bending are absorbed by the slide which takes place between the single-layer flexible circuit boards, thus successfully improving the flexing resistance of the flexing sections.

Figure 2:
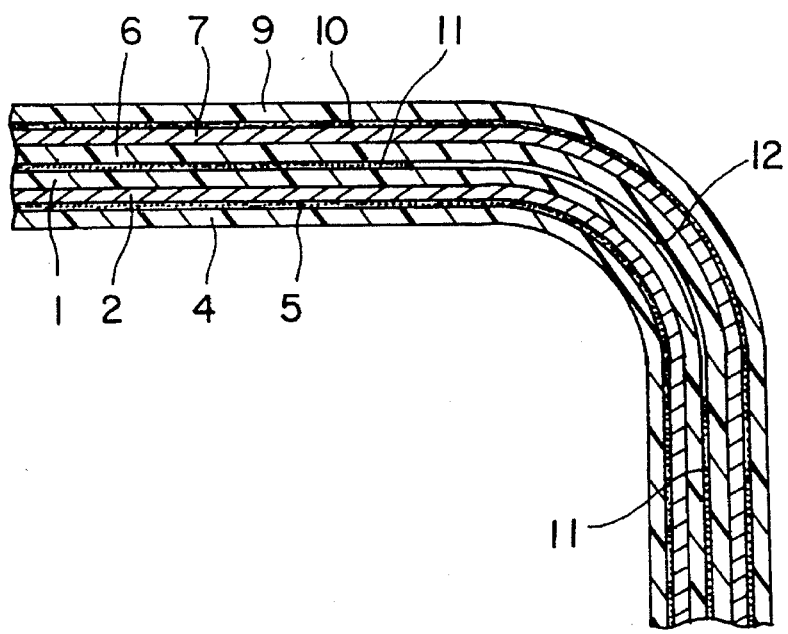
FIG. 2 is a conceptual enlarged cross-sectional view which shows the structure of the essential part of the flexing section of a multilayer flexible circuit board according to another embodiment of the present invention.

According to the structure of the flexing section of the multilayer flexible circuit board shown in FIG. 2, no adhesive agent layer is provided, i.e., a non-adhesive board lined with copper on one surface is provided, between the flexible insulation base materials 1, 6 and the wiring conductors 2, 7 to constitute the respective single-layer flexible circuit boards. The single-layer flexible circuit boards are mutually laminated by providing the non-bonded portion 12 so as not to bond the flexing section as in the embodiment described above while forming the bonded portion 11 for mutual bonding in other areas than the non-bonded portion 12.

The structure of the flexing section composed of multiple layers of flexible circuit boards which use such non-adhesive agent type boards lined with copper on one surface allows the overall thickness to be reduced, enabling still higher flexing resistance of the flexing section.

Figure 3:
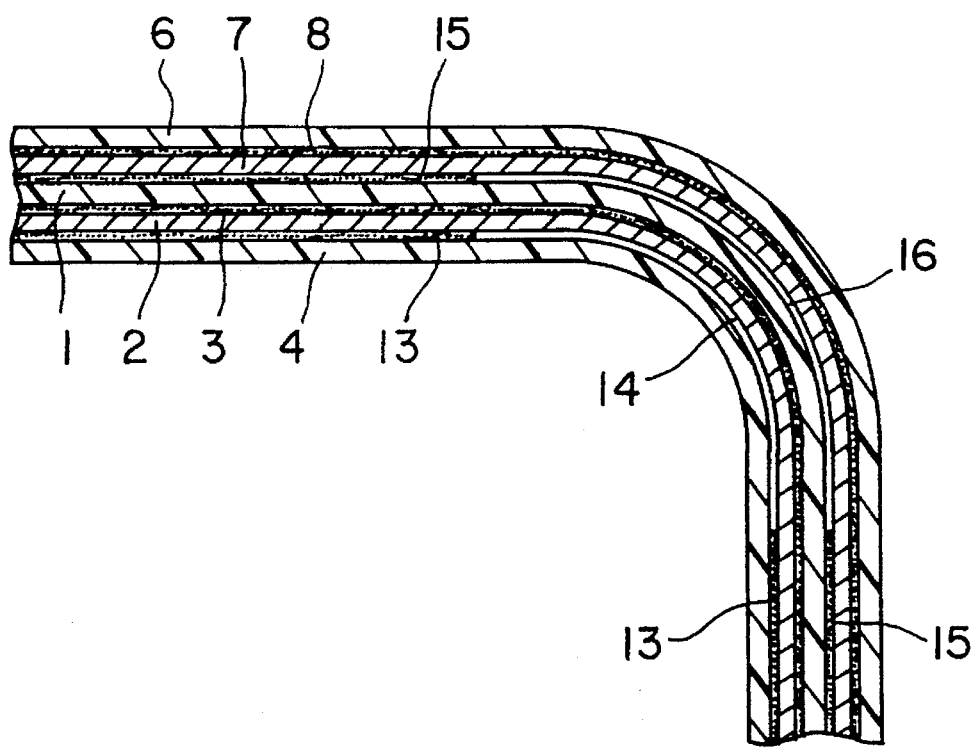
FIG. 3 is a conceptual enlarged cross-sectional view which shows the structure of the essential part of the flexing section of a multilayer flexible circuit board according to still another embodiment of the present invention.

Furthermore, according to the structure of the flexing section of the multilayer flexible circuit board shown in FIG. 3, when producing the surface protective layer 4 on the surface of the wiring conductor 2 in one flexible circuit board, a non-bonded portion 14, which is free of an adhesive agent, is formed on the flexing section, while a bonded portion 13, which is bonded with the adhesive agent, is provided in other area than the non-bonded portion 14. The other flexible circuit board is configured with no surface protective layer for the wiring conductor 7. To laminate and bond the other flexible circuit board to the aforesaid flexible circuit board, they are laid out so that the wiring conductor 7 of the other flexible circuit board faces against the outer surface of the flexible insulation base material 1 of the aforesaid flexible circuit board; a non-bonded portion 16 free of bonding is provided at the flexing section, while a bonded portion 15 for mutual bonding is provided in other area than the non-bonding portion.

The flexing section of the structure stated above, i.e., the multilayer flexible mode, allows a plurality of non-bonded portions 14, 16 to be formed. In this case, the non-bonded portions 14, 16 can be located inside the flexing sections; therefore, the tensile stress at the flexing sections of the wiring conductors 2, 7 can be further reduced.

According to the structure of the flexing section of the multilayer flexible circuit board according to the present invention, a structure can be achieved wherein a plurality of single-layer flexible circuit boards are laid out adjacently to each other in the non-bonded portion of the flexing section free of an adhesive agent. Due to this structure, the expansion and contraction of the wiring conductors caused by bending are absorbed by the slide between the single-layer flexible circuit boards, thus making it possible to successfully achieve higher flexing resistance of the flexing section.

Moreover, the use of the structure of the flexing section in flexible circuit boards which are laminated in multiple layers and which use non-adhesive agent boards lined with copper on one surface, allows the overall thickness to be reduced, enabling further improved flexing resistance of the flexing section.

Furthermore, the structure wherein a plurality of non-bonded portions are configured at the flexing section of the multilayer flexible type allows the non-bonded portions to be located inside the flexing sections, permitting further reduced tensile stress at the flexing sections of the respective wiring conductors.

What is claimed is:

1. A structure of the flexing section of a multilayer flexible circuit board in a multilayer flexible circuit board wherein at least one layer of a flexible insulation base material is bonded, via an adhesive agent layer, between a plurality of wiring conductors on which required wiring patterns are formed with conductive foil, said flexible insulation base material of the flexing section of the multilayer flexible circuit board being provided with a non-bonded portion so that it is not bonded with said wiring conductors or another flexible insulation base material at least on one surface.

2. A structure of the flexing section of a multilayer flexible circuit board according to claim 1, wherein said multilayer flexible circuit board is composed of an adhesive-free board lined with copper on one surface.

3. A structure of the flexing section of a multilayer flexible circuit board according to claim 1, wherein said non-bonded portion in said multilayer flexible circuit board is located inside the flexing section of said wiring conductor.

4. A structure of the flexing section of a multilayer flexible circuit board according to claim 2, wherein said non-bonded portion in said multilayer flexible circuit board is located inside the flexing section of said wiring conductor.

5. A structure of the flexing section of a multilayer flexible circuit board according to claim 1, wherein said non-bonded portion formed on the flexing section can be formed also between the wiring conductor and a surface protective layer provided on the surface of the wiring conductor.

6. The circuit of claim 1 wherein bonding means comprises a layer of adhesive interposed between said substrates.

7. The circuit of claim 6 wherein at least one of said conductive layers is in contact with but not bonded to its associated substrate at least in said flexing section.

8. The circuit of claim 6 wherein at least one of said conductive layers is adhesively bonded to its associated substrate.

9. The circuit of claim 6 further comprising a protective layer overlying each of said conductive layers and being bonded thereto, said protective layers being generally coextensive in length and width with said circuit.

10. The circuit of claim 9 wherein at least one of said conductive layers is in contact with but not bonded to its associated substrate.

11. The circuit of claim 9 wherein said conductive layers are in contact with but not bonded to their associate substrates at least in said flexing section.

12. The circuit of claim 9 wherein at least one of said conductive layers is adhesively bonded to its associated substrate.

13. The circuit of claim 9 wherein said conductive layers are adhesively bonded to their associated substrates.

14. A flexible, multi-layer printed circuit, said circuit having a length and a width, said circuit including at least two conductive layers which define wiring patterns of said circuit, each of said conductive layers being supported by a first surface of an associated flexible non-conductive substrate, said substrates having length and width dimensions commensurate with said circuit, and means for bonding said substrates to one another with said conductive layers facing in opposite directions to thereby integrate said conductive layer defined wiring patterns into a unitary multi-layer circuit, said bonding means including at least a first discontinuity which projects over the complete width of said substrates and extends in the direction of the length of said substrates, said discontinuity defining a flexing section of said multi-layer circuit of predetermined size and shape, said substrates not being bonded to one another in said flexing section whereby the individual of said conductive layers may be subjected to different degrees of distortion when said circuit is formed into a non-linear shape by bending in the region of said flexing section.

15. A flexible, multi-layer printed circuit, said circuit having a length and a width, said circuit including a flexible, non-conductive substrate, said substrate having a pair of oppositely disposed surfaces, a pair of conductive layers which define wiring patterns of said multilayer circuit, each of said conductive layers being supported by a respective surface of said substrate, said substrate having length and width dimensions commensurate with said mull-layer circuit, and means for bonding said conductive layers to said substrate to thereby integrate said conductive layer defined wiring patterns into a unitary multilayer circuit, said bonding means extending substantially the width of said substrate on both surfaces thereof, said bonding means including at least a first discontinuity on one side of said substrate, said discontinuity projecting over the complete width of said substrate and extending in the direction of the length of said substrate, said discontinuity defining a flexing section of said multilayer circuit of predetermined size and shape, said substrate not being bonded to one of said conductive layers in said flexing section whereby said conductive layers may be subjected to different degrees of distortion when said circuit is formed into a non-linear shape by bending in the region of said flexing section.

16. The multilayer circuit of claim 15 further comprising a protective layer overlying each of said conductive layers, said protective layers being generally coextensive in length and width with said multilayer circuit; and means for securing said protective layers to said conductive layers, said securing means extending substantially the width of said protective layers and including at least a first discontinuity located generally in registration with said first discontinuity of said bonding means, said first discontinuity of said securing means resulting in a lack of attachment of the first of said protective layers to an adjacent conductive layer in said flexing section of said multilayer circuit.

17. The multilayer circuit of claim 16 wherein said discontinuity in said bonding means and said discontinuity in said securing means are located on opposite sides of said substrate.

* * * * *